United States Patent [19]

Dow et al.

[11] Patent Number: 5,716,866
[45] Date of Patent: Feb. 10, 1998

[54] METHOD OF FORMING A SEMICONDUCTOR DEVICE

[75] Inventors: Diann M. Dow, Chandler; Robert B. Davies, Tempe; Vida Ilderem, Phoenix, all of Ariz.

[73] Assignee: Motorola, Inc., Schaumburg, Ill.

[21] Appl. No.: 566,320

[22] Filed: Dec. 1, 1995

Related U.S. Application Data

[63] Continuation-in-part of Ser. No. 521,504, Aug. 30, 1995, abandoned.

[51] Int. Cl.[6] .................................................. H01L 21/265
[52] U.S. Cl. .................................. 437/44; 437/40; 437/41; 437/913
[58] Field of Search ............................. 437/44, 40, 41, 437/34, 56, 913, 45

[56] References Cited

U.S. PATENT DOCUMENTS

| | | |
|---|---|---|
| 5,026,657 | 6/1991 | Lee et al. .................. 437/34 |
| 5,112,766 | 5/1992 | Fujii et al. .................. 437/44 |
| 5,342,802 | 8/1994 | Kubokoya et al. .......... 437/44 |
| 5,371,394 | 12/1994 | Ma et al. .................... 257/335 |
| 5,427,964 | 6/1995 | Kaneshiro et al. .......... 437/41 |
| 5,441,906 | 8/1995 | Burger ........................ 437/44 |
| 5,482,878 | 1/1996 | Burger et al. ............... 437/44 |
| 5,491,101 | 2/1996 | Miyamoto et al. .......... 437/44 |

*Primary Examiner*—Tuan H. Nguyen
*Attorney, Agent, or Firm*—Bruce T. Neel; Rennie William Dover

[57] ABSTRACT

A method for forming a unilateral, graded-channel field effect transistor and a transistor stock 200 that includes providing a substrate (10) with an overlying gate electrode (14, 16). A spacer (23) is formed on only the drain side of the electrode. A graded-channel region (36) is formed aligned to the source side of the electrode while the spacer protects the drain side of the channel region. Source/drain regions (38) are formed, the spacer is removed, and then a drain extension region (40) is formed aligned to the drain side of the electrode.

27 Claims, 6 Drawing Sheets

METHOD OF FORMING A SEMICONDUCTOR DEVICE

This application is a continuation-in-part of prior application Ser. No. 08/521,504, filed Aug. 30, 1995, now abandoned.

BACKGROUND OF THE INVENTION

The present invention relates, in general, to semiconductor devices and, more particularly, to field effect transistors.

A unilateral, graded-channel insulated gate field effect transistor (IGFET) has a channel region with a laterally graded dopant profile. Typically, a graded channel region is formed under the gate electrode and extends from the doped source region a significant distance under the gate electrode into the channel region. The device is described as "unilateral" because the graded channel region is formed on only the source side of the device. The graded channel region uses a dopant of the same conductivity type as the substrate or well in which the IGFET is formed, and the carrier concentration profile varies gradually from a maximum concentration at the interface with the source region to a minimum concentration corresponding to the background carrier concentration (in other words, the carrier concentration of the substrate or well). A graded channel provides several advantages including higher carrier mobility, lower body effect, higher punch-through resistance, and lower sensitivity to gate length.

The device sensitivities of a unilateral, graded-channel IGFET are significantly different from those of a uniform channel IGFET and thus several problems associated with their manufacture have not been addressed in the past. First, when forming a graded channel IGFET, it is sometimes desirable to form the graded channel region using an angled ion implantation, which is difficult because it requires a masking technique having a low aspect ratio. Also, it is often desirable to dope the gate electrode in the same step as the source/drain regions, which is impractical when using a photoresist mask for a sub-micron device due to the desire to have a lightly-doped drain (LDD) extension on only the drain side of the device.

Further, when doping using photoresist masks with sub-micron devices, it is difficult to consistently avoid contamination of the channel region on the drain side of the gate electrode by dopant intended for the graded channel region on the source side due to photoresist mask misalignments. This problem is particularly acute when several devices are coupled in series and minimally-spaced, with a common source/drain region acting as the source region of one device and the drain region of the second device. When so minimally-spaced the common source/drain region has a size corresponding to a design rule minimum dimension, and the misalignment of the photoresist mask used for doping the graded channel region on the source side of the first device will permit some graded-channel dopant to diffuse into the channel region on the drain side of the second device.

Another problem encountered when using minimally-spaced devices as discussed above is that a photoresist mask misalignment can result in an insufficient surface area of the substrate being exposed on the source side of a device such that the graded channel region cannot be fully formed. This source-limited diffusion occurs because there is an inadequate initial supply of dopant due to the small substrate area exposed on the source side of the device. Accordingly, there is a need for an improved method of forming graded-channel field effect transistors that reduces the adverse effects of the several problems described above.

DETAILED DESCRIPTION OF THE DRAWINGS

Figure 1:
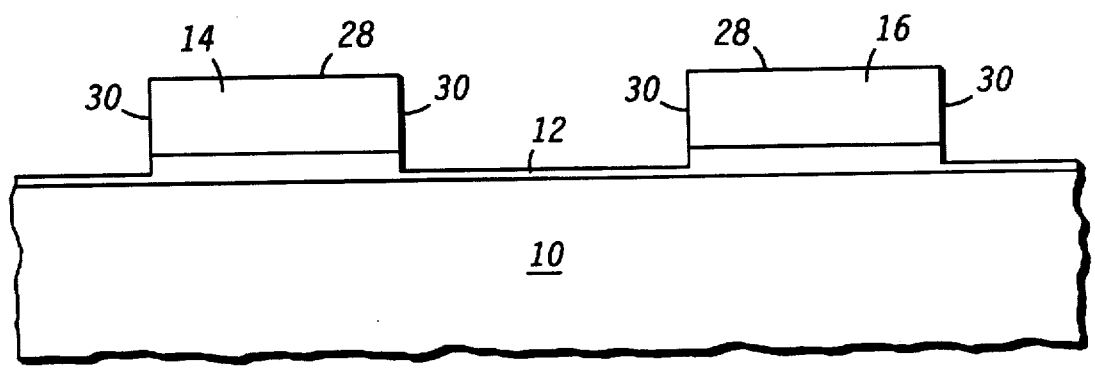
FIGS. 1–9 are cross-sectional views illustrating various stages in the formation of a semiconductor device structure in accordance with a first embodiment of the present invention.

The present invention provides an improved method for forming a unilateral, graded-channel field effect transistor. According to this method, a gate electrode is provided overlying a semiconductor substrate. A spacer is formed adjacent to the gate electrode on the drain side of the transistor, and a graded-channel doped region is formed in the semiconductor substrate on the source side of the transistor. The graded-channel doped region is aligned to the gate electrode, and the spacer substantially reduces the extent to which any graded-channel dopant diffuses under the gate electrode on the drain side. After the graded-channel dopant is introduced into the substrate, the spacer can either be removed or used for forming a lightly-doped drain extension region.

Another advantage of the present invention is the ability to manufacture stacked, unilateral, graded-channel semiconductor devices wherein the source of one transistor is common with the drain of another transistor. Further, the semiconductor devices of the transistor stack can be asymmetric wherein the source end of the common source-drain region is more heavily doped than the drain end of the common source-drain region.

FIGS. 1–9 are cross-sectional views illustrating stages in the formation of a stacked, unilaterally graded-channel semiconductor device in accordance with a first embodiment of the present invention. It should be understood that the same reference numerals are used in the figures to denote the same elements. Specifically, by way of example only, an N-channel, enhancement-mode device is described herein, but those skilled in the art will readily recognize that substitutions of dopant types, materials and processes can be made to the following described methods while remaining within the scope of the present invention. For example, P-channel devices can also be formed using the present invention with appropriate changes in dopant conductivity types.

In FIG. 1 a semiconductor substrate 10 is provided, which is preferably silicon and lightly-doped to have a P-type conductivity. An insulating layer 12 of, for example, grown silicon oxide of about 100 angstroms thickness, is formed on substrate 10 to provide a gate insulating layer for the final devices. Gate electrodes 14 and 16, which are preferably polysilicon, are formed on insulating layer 12. As is known, etching of polysilicon to form electrodes 14 and 16 typically thins insulating layer 12 in the regions between electrodes 14 and 16. Gate electrodes 14 and 16 have a top surface 28 and sidewalls 30. If desired, gate electrodes 14 and 16 can be minimally-spaced in order to share a common source/drain region to be formed later. Typically, no contact will be placed between gate electrodes 14 and 16 when they are minimally-spaced.

Figure 2:
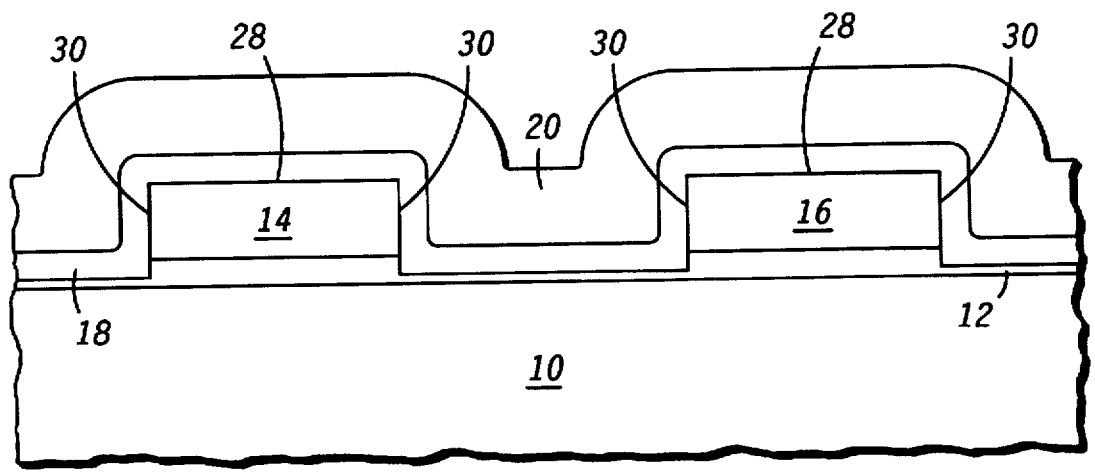

In FIG. 2, a blanket, conformal dielectric layer 18 is formed over insulating layer 12 and electrodes 14 and 16. Dielectric layer 18 is, for example, a deposited silicon oxide layer of about 100–200 angstroms thickness. Next, a blanket spacer layer 20, which is preferably polysilicon having a thickness of about 1,000–2,500 angstroms, is formed over dielectric layer 18. Spacer layer 20 will be etched next to form spacers.

Figure 3:
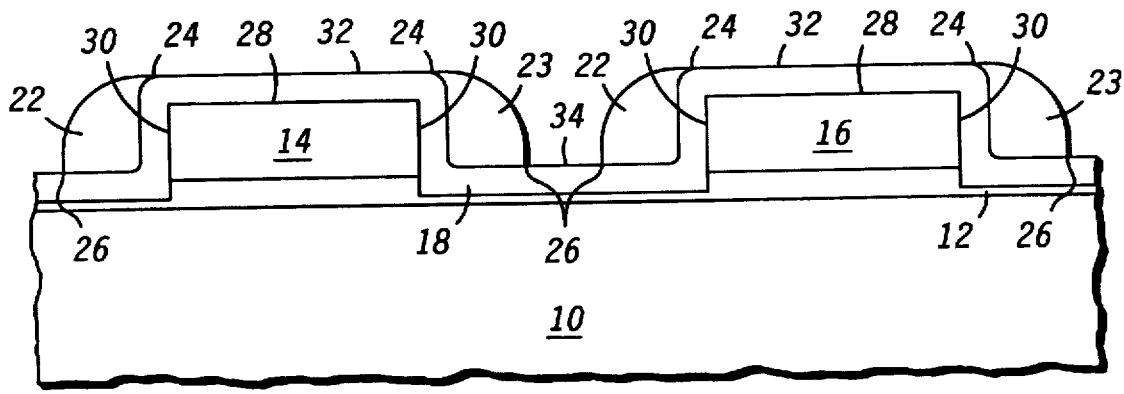

Referring to FIG. 3, spacer layer 20 is anisotropically etched to form spacers 22 and 23 adjacent to sidewalls 30. Spacers 22 and 23 have bottom corners 26 distal from electrodes 14 and 16, and spacers 22 and 23 further have top corners 24 proximate to electrodes 14 and 16 and a top surface 32 of dielectric layer 18. The base width of spacers 22 and 23 is preferably about 0.1–0.2 microns. During this etch, dielectric layer 18 is used as an etch stop. For the preferred case where dielectric layer 18 is silicon oxide and spacer layer 20 is polysilicon, the etch selectivity ratio is about 100:1, which assists in the formation of spacers 22 and 23 as just described. Following this etch, top surface 32 and a bottom surface 34 of dielectric layer 18 are substantially free of spacer layer 20.

Figure 4:
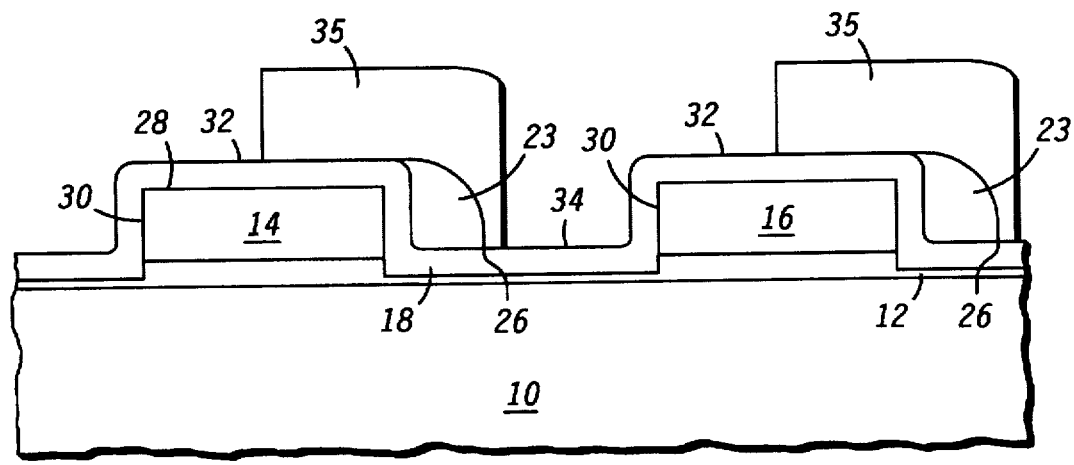

FIG. 4 illustrates a processing stage in which spacers 22 (see FIG. 3) have been removed in preparation for the formation of a unilaterally-doped device. Spacers 22 correspond to the source side of each device, and spacers 23 correspond to the drain side as will become more clear below. A mask 35 of, for example, photoresist is formed and patterned to protect spacers 23. Then, spacers 22 are removed by, for example, conventional etching again using dielectric layer 18 as an etch stop.

Figure 5:
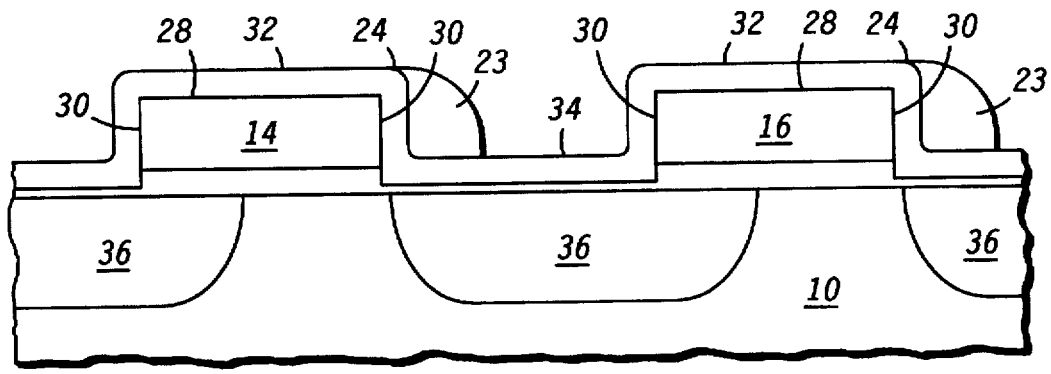

FIG. 5 illustrates the formation of graded-channel doped regions 36 in substrate 10. Doped regions 36 have the same conductivity type as substrate 10, which is P-type in this example. Doped regions 36 are preferably formed using an ion implantation of boron at a dose of $4.5 \times 10^{13}$ atoms/cm$^2$ and an energy of 20 keV. This ion implantation can be performed normal to the surface of substrate 10 or at an angle thereto. Spacers 22 (see FIG. 3) were removed so that doped regions 36 are substantially aligned to sidewalls 30 on the source side of each device. Spacers 23 are retained during doping so that diffusion of the graded-channel dopant is substantially reduced into the drain side of the channel region of each device. If too much graded-channel dopant is introduced into the drain side of the channel, the threshold voltage will increase, the body effect will increase, and mobility will be reduced resulting in a lower drive current. Further, the graded-channel dopant can adversely counter-dope the drain extension regions to be formed later in the process resulting in reduced effectiveness in field-shaping on the drain side of the channel.

Following implantation, doped regions 36 are thermally annealed to extend doped regions 36 substantially into the channel region on the source side of each device. This thermal anneal also activates doped region 36. By way of example, a 10–100 minute anneal at a temperature of about 875°–1,000° C. in a non-oxidizing ambient can be used.

An advantage of the present invention is that spacers 23 have a low profile such that they do not fully or partially block a steep angled implantation of graded-channel dopant. In contrast, a masking technique using a photoresist has a profile significantly higher such that steep angled implantation is not practical because of photoresist shadowing. It should be appreciated that a low profile for spacers 23 as in the present invention is more important when electrodes 14 and 16 are minimally spaced and no contact is to be formed to the source/drain region therebetween.

Although the present invention can be used with larger-geometry graded-channel devices, it is particularly advantageous for devices having gate electrodes 14 and 16 separated by a distance, as measured from the inner sidewall 30 of the first device to the closest inner sidewall 30 of the second device, of about 0.8 microns or less. Also, the extent to which doped regions 36 extend under electrodes 14 and 16 depends upon many factors, as recognized by one of skill in the art, including implant angle, energy, and dose as well as thermal drive time and temperature. As one specific example of typical device geometries for a sub-micron device, for a gate electrode length of about 0.6 microns, doped regions 36 extend about 0.15–0.30 microns from sidewalls 30 into the channel region on the source side. One of skill in the art will recognize, however, that many other variations in geometry are possible, which still fall within the scope of the present invention.

Another advantage of the present invention is that spacers 23 are used both for blocking graded-channel dopant from the channel region on the drain side of the device and for later forming LDD extension regions 40 (see FIG. 7). Thus, an extra mask step is avoided by this common usage.

Further details regarding the manufacture of graded-channel field effect transistors are described in both Ma et al., U.S. Pat. No. 5,371,394, entitled "Double Implanted Laterally Diffused MOS Device and Method Thereof", issued Dec. 6, 1994, and Kaneshiro et al., U.S. Pat. No. 5,427,964, entitled "Insulated Gate Field Effect Transistor and Method for Fabricating", issued Jun. 27, 1995, which are both hereby incorporated by reference in full.

Figure 6:
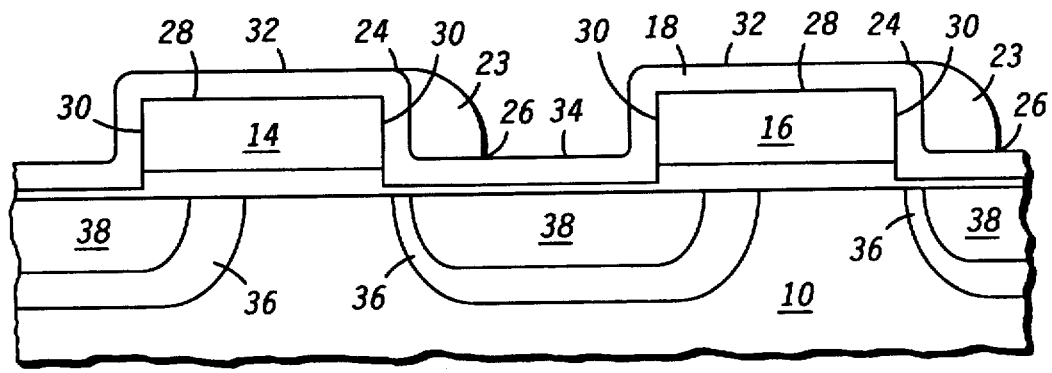

In FIG. 6, source/drain doped regions 38 are formed, preferably using a common single ion implantation step. In preparation for the formation of source/drain doped regions 38, a previously-formed photoresist mask (not shown) has been patterned to expose only the N-channel devices of the circuit being manufactured. Doping of other devices of the circuit, such as P-channel devices, is blocked during this implant.

Although it is preferred that doped regions 38 be formed in a single implantation step, the source and drain regions can be formed separately, which variation still falls within the scope of the present invention. On the source side of gate electrodes 14 and 16, doped regions 38 are formed substantially aligned with sidewall 30. This doping is done through dielectric layer 18, which has a thickness sufficiently small so that this alignment is substantially not affected. On the drain side of each device, doped regions 38 are substantially aligned to bottom corners 26 of spacers 23. Spacers 23 are retained for an optional lightly-doped drain extension region to be formed later in the process. However, if such an extension region is not necessary, then spacers 23 can be removed prior to the formation of doped regions 38 so that the drain regions thereof are substantially aligned to sidewalls 30 on the drain side of each device. By way of example, doped regions 38 can be formed using an arsenic implant of $3 \times 10^{15}$ atoms/cm$^2$ at 90 keV, followed by an activation anneal, such as, for example, a rapid thermal anneal (RTA) of about 30 seconds at 1,025° C.

It should also be appreciated that gate electrodes 14 and 16 are preferably doped using the same ion implantation used to form doped regions 38. This simultaneous doping of gate electrodes 14 and 16 is an advantage of the present invention due to the use of spacers 23 and the exposed top surface 32 of dielectric layer 18.

Figure 7:
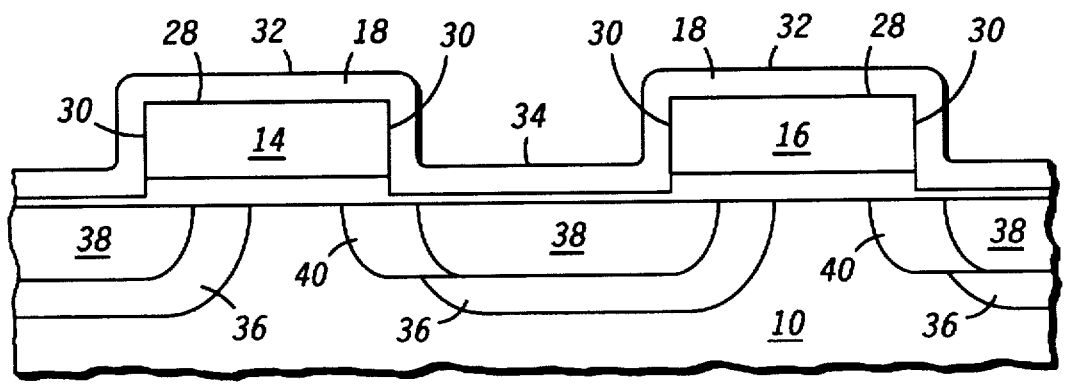

FIG. 7 illustrates the formation of lightly-doped drain extension regions 40. Spacers 23 (see FIG. 6) are removed, for example, by etching. Preferably, the photoresist mask (not shown) used when forming source/drain doped regions 38 and discussed above is not removed during this etch and further remains in place when doping extension regions 40. Next, extension regions 40 are formed substantially aligned with sidewalls 30 of gate electrodes 14 and 16 on the drain side of each device, preferably using an ion implantation of, for example, phosphorus at 120 keV and a dose of $4 \times 10^{12}$ atoms/cm$^2$. As is known, extension region 40 preferably has a dopant concentration less than that of doped regions 38. Extension region 40 is disposed adjoining doped region 38 on the drain side.

As just discussed, extension regions 40 are preferably formed with the same photoresist mask (not shown) used to form source/drain doped regions 38. This photoresist mask restricts implant of LDD dopant to the N-channel device layout of the circuit being manufactured.

It should be noted that, when using this preferred approach, the same dopant used to form extension regions 40 will also be introduced into substrate 10 on the source side of the device. However, as will be recognized by one of skill in the art, source doped regions 38 will diffuse further than the dopant used to form extension regions 40. Source doped region 38 is about 1,000 times more highly doped than extension region 40, and as a result, the dopant in source doped region 38 will diffuse faster. An anneal can, if necessary, be done after forming source/drain doped regions 38 and prior to forming extension region 40, but the above photoresist mask must be removed and then re-applied following this anneal. Preferably, a single activation anneal is used to activate doped regions 38 and 40. Such an anneal can be, for example, a rapid thermal anneal of about 30 seconds at about 1,025° C.

If dopant in source doped region 38 does not diffuse further than extension dopant introduced on the source side of each device, there will be increased source resistance and increased threshold voltage variation due to the light compensation of the graded-channel implant by the extension dopant.

Figure 8:
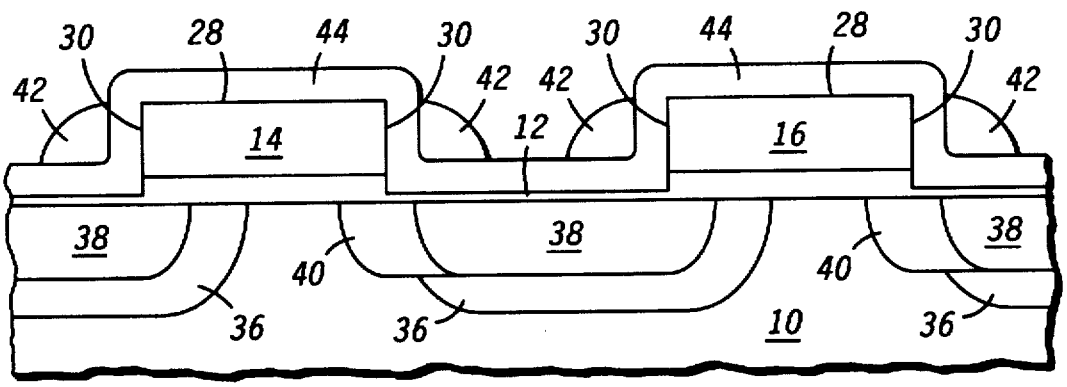

Next, as illustrated in FIG. 8, dielectric spacers 42 are formed, for example, by depositing a blanket layer (not shown) of tetraethylorthosilicate (TEOS) on dielectric layer 18 to a thickness of about 200 angstroms and then densifying the deposited TEOS layer. This is represented in FIG. 8 as a dielectric layer 44, which is the combination of old dielectric layer 18 and the new TEOS layer. Next, a silicon nitride layer (not shown) of about 2,000 angstroms thickness is deposited on the TEOS layer, and the nitride layer is anisotropically etched back to provide spacers 42 using conventional techniques.

Figure 9:
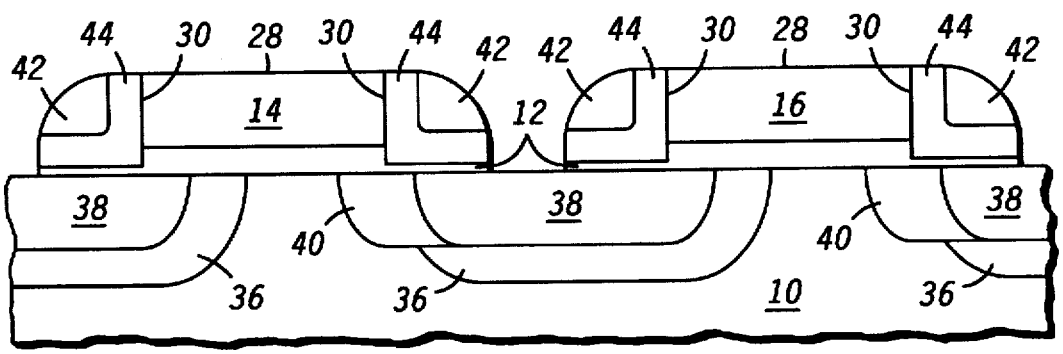

In FIG. 9, the top surfaces of dielectric layer 44 are etched back to substantially expose top surfaces 28 of gate electrodes 14 and 16. Also, preferably in the same etch step, the portions of dielectric layer 44 and insulating layer 12 between spacers 42 are removed to expose the top surfaces of source/drain doped regions 38. Next, conventional silicide layers (not shown) are preferably formed over source/drain doped regions 38 and gate electrodes 14 and 16. Finally, conventional processing is used to provide contacts (not shown) to doped regions 38 and to complete the devices.

Figure 10:
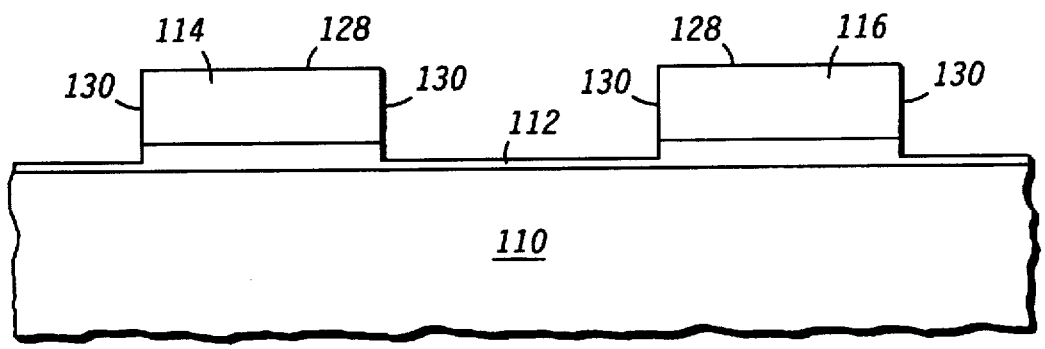
FIGS. 10–17 are cross-sectional views illustrating various stages in the formation of semiconductor devices in accordance with a second embodiment of the present invention.

FIGS. 10–17 are cross-sectional views illustrating various stages in the formation of a stacked, unilateral, graded-channel IGFET 100 in accordance with another embodiment of the present invention. FIG. 10 illustrates a semiconductor substrate 110 at an initial stage of processing. By way of example, semiconductor substrate 110 is silicon doped with an impurity material of P-type conductivity having a resistivity ranging from approximately 6 ohm-centimeter ($\Omega$-cm) to approximately 8 $\Omega$-cm. A layer of dielectric material 112 having a thickness of approximately 100 angstroms is formed on semiconductor substrate 110. Layer of dielectric material 112 serves as a gate oxide layer for IGFET 100. Gate electrodes 114 and 116 are formed on gate oxide layer 112. By way of example, gate electrodes 114 and 116 are polysilicon and have a top surface 128 and sidewalls 130. After the formation of gate electrodes 114 and 116, portions of gate oxide layer 112 that are not covered by gate electrodes 114 and 116 remain. It should be noted that gate electrodes 114 and 116 can be minimally-spaced in order to share a common source/drain region, which is described with reference to FIG. 15. It should be further noted that a contact will not be formed between gate electrodes 114 and 116 when they are minimally-spaced.

Figure 11:
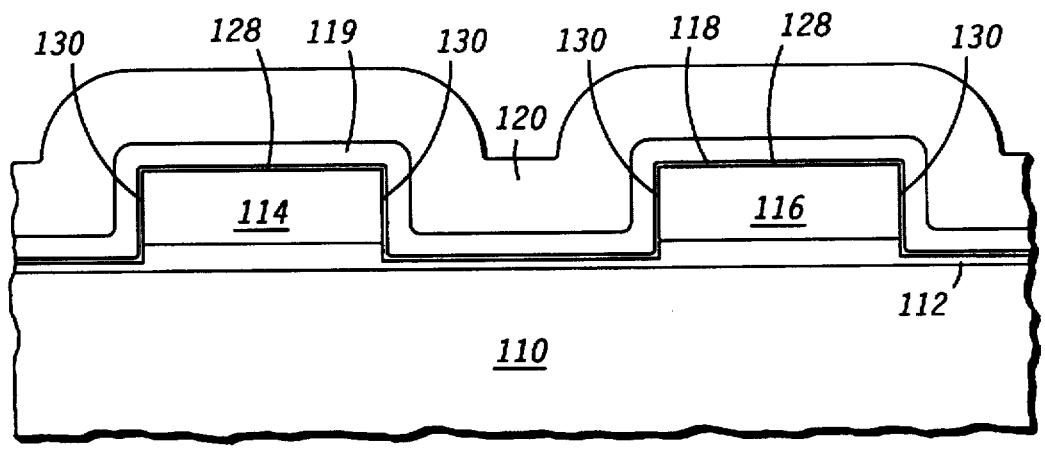

Now referring to FIG. 11, a layer of oxide 118 having a thickness of between approximately 100 and approximately 200 angstroms is formed on gate electrodes 114 and 116 and the portions of gate oxide layer 112 that are not covered by gate electrodes 114 and 116. By way of example, oxide layer 118 is formed by oxidizing gate electrodes 114 and 116 using thermal oxidation techniques. Although the portions of oxide layer 118 that are formed on the uncovered portions of gate oxide 112 are shown as a separate layer, it should be understood these portions of oxide layer 118 serve to thicken gate oxide 112 on those surfaces which are not covered by gates 114 and 116.

Still referring to FIG. 11, a layer of nitride 119 having a thickness of approximately 100–400 angstroms is deposited on oxide layer 118. Further, a layer of deposited oxide 120 having a thickness ranging between approximately 1,000 angstroms and approximately 2,000 angstroms is deposited on nitride layer 119. By way of example, oxide layer 120 is TEOS. Oxide layer 120 is used to set the spacer width as described with reference to FIG. 12. It should be noted that the combination of dielectric layers 118 and 119 serve a similar function as oxide layer 18 of the first embodiment, and oxide layer 120 serves as similar function as polysilicon layer 20 of the first embodiment.

Figure 12:
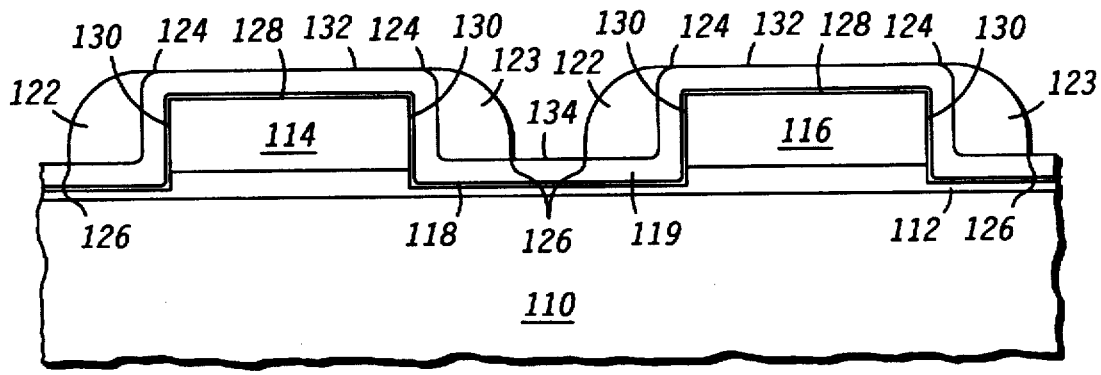

Now referring to FIG. 12, oxide layer 120 is anisotropically etched to form spacers 122 and 123 adjacent to sidewalls 130. Spacers 122 and 123 have bottom corners 126 distal from electrodes 114 and 116, and spacers 122 and 123 further have top corners 124 proximate to electrodes 114 and 116 and a top surface 132 of nitride layer 119. By way of example, the base width of spacers 122 and 123 is about 0.1 to 0.2 microns. During the etching of oxide layer 120, nitride layer 119 is used as an etch stop. Following this etch, top surface 132 and bottom surface 134 of nitride layer 119 are substantially free of oxide layer 120.

Figure 13:
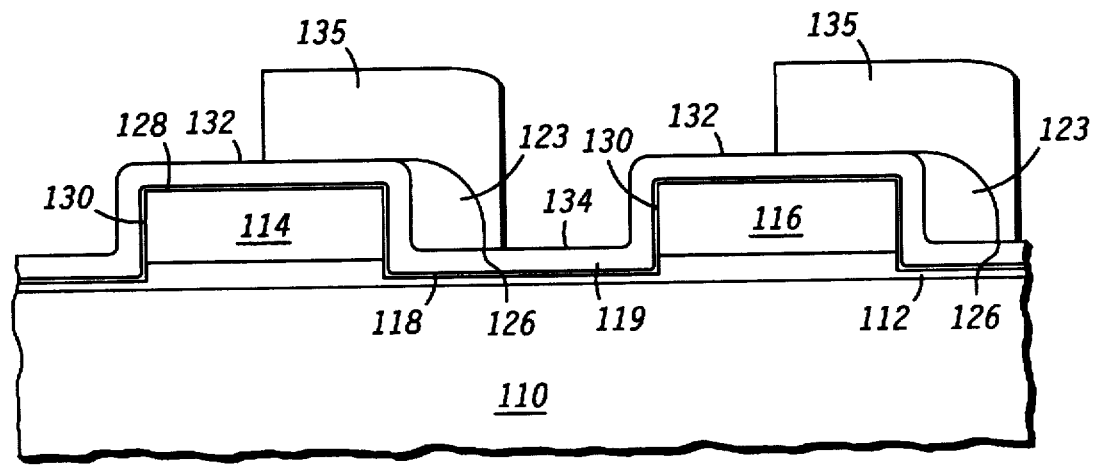

Now referring to FIG. 13, a processing stage in which spacers 122 (shown in FIG. 12) have been removed in preparation for the formation of a unilaterally-doped device is shown. Spacers 122 correspond to the source side of each device, and spacers 123 correspond to the drain side of each device. A mask 135 of, for example, photoresist is formed and patterned to protect spacers 123. Then, spacers 122 are removed using, for example, conventional wet-etching techniques, wherein nitride layer 119 serves as an etch stop. It should be noted that benefits of the present invention include protection of the field oxide regions and the gate oxide by nitride layer 119 during the wet-etch operation.

Figure 14:
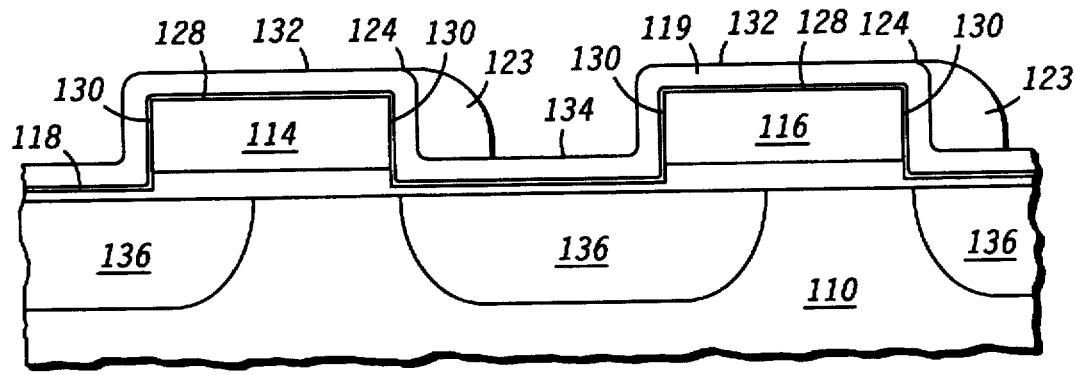

FIG. 14 illustrates the formation of graded-channel doped regions 136 in substrate 110. Doped regions 136 are of the same conductivity type as substrate 110. By way of example, doped regions 136 are formed using an ion implantation technique, wherein boron is implanted into substrate 110 at a dose of $4.5 \times 10^{13}$ atoms/cm$^2$ and an energy of 20 keV. The ion implantation step may be performed normal to the surface of substrate 110 or at an angle thereto. Spacers 122 (shown in FIG. 12) were removed so that doped regions 136 are substantially aligned to sidewalls 130 on the source side of each device. Analogous to the embodiment of FIGS. 1–9, spacers 123 were retained during the doping step so that the diffusion of the graded-channel dopant is substantially reduced on the drain side of the channel region of each device.

Following implantation, doped regions 136 are thermally annealed to extend doped regions 136 substantially into the channel region on the source side of each device. This thermal anneal also activates doped region 136. By way of example, the anneal is performed for a period of time ranging between, approximately 10 minutes and 100 minutes at a temperature ranging between, approximately, 875° C. and 1,000° C. in a non-oxidizing ambient.

Figure 15:
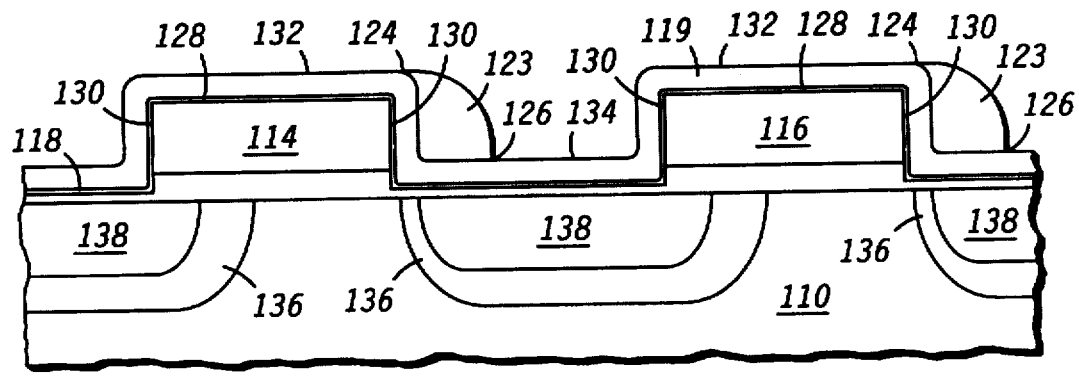

Now referring to FIG. 15, a layer of photoresist (not shown) is patterned on spacers 123 and portions of nitride layer 119 to form a photoresist mask. In accordance with one embodiment, only the N-channel devices of the circuit being manufactured are exposed by the photoresist mask. Doping of other devices of the circuit, such as P-channel devices, is blocked during this implant. Source/drain regions 138 are formed using, for example, a common single ion implantation step. On the source side of gate electrodes 114 and 116, doped regions 138 are aligned with sidewall 130. The thicknesses of nitride layer 119 and oxide layers 112 and 118 are sufficiently small to permit penetration of dopant through layers 119, 118, and 112 without affecting the alignment of source regions 138. On the drain side of each device, doped regions 138 are aligned to bottom corners 126 of spacer 123. Spacers 123 are retained for an optional lightly-doped drain extension region to be formed later in the process. It should be understood that such a drain extension region is not necessary and that spacers 123 can be removed prior to the formation of doped regions 138 so that the portions of doped regions 138 that serve as drain regions are aligned to sidewalls 130 on the drain side of each device. By way of example, doped regions 138 can be formed using an arsenic implant of $3 \times 10^{15}$ atoms/cm$^2$ at 90 keV, followed by an activation anneal, such as, for example, a rapid thermal anneal (RTA) of about 30 seconds at 1,025° C. In addition, gate electrodes 114 and 116 are preferably doped using the same ion implantation step used to form doped regions 138.

Figure 16:
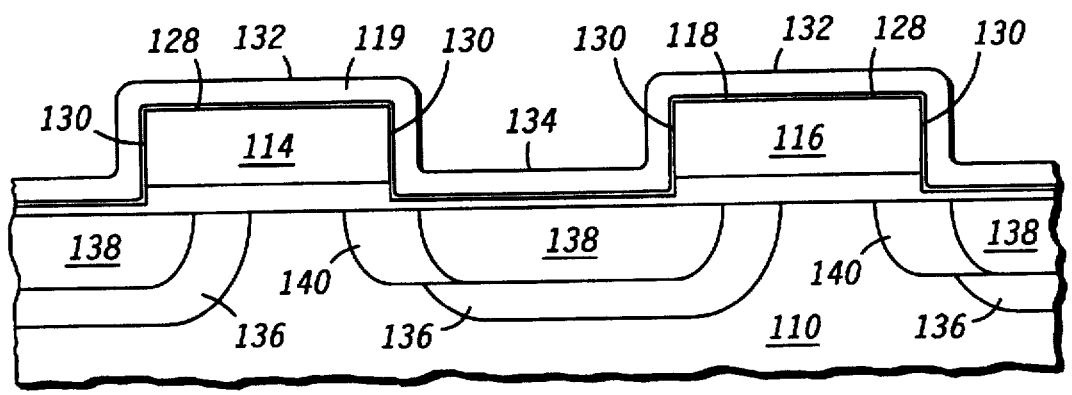

FIG. 16 illustrates the formation of lightly-doped drain extension regions 140. Spacers 123 (shown in FIGS. 14 and 15) are removed by, for example, wet etching. In accordance with one example, the photoresist mask (not shown) that was used when forming source/drain doped regions 138, and described with reference to FIG. 14, remains in place when forming extension regions 140. Drain extension regions 140 are formed substantially aligned with sidewalls 130 of gate electrodes 114 and 116 on the drain side of each device. By way of example, drain extension regions 140 are formed by implanting phosphorus at a dose of $4 \times 10^{12}$ atoms/cm$^2$ and an implant energy of 120 keV. Preferably, drain extension region 140 has a dopant concentration less than that of doped regions 138. Drain extension region 140 is disposed adjoining doped region 138 on the drain side.

Figure 17:
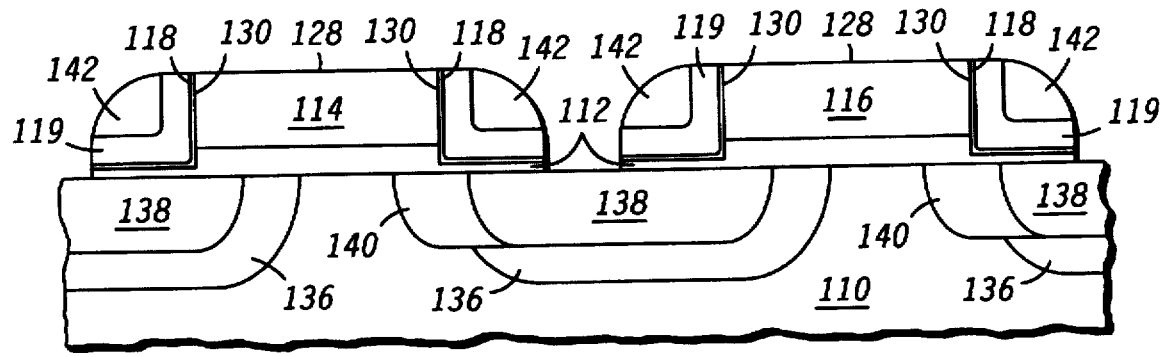

Now referring to FIG. 17, dielectric spacers 142 are formed by, for example, depositing a blanket layer (not shown) of nitride on nitride layer 119 to a thickness of about 2,000 angstroms. The nitride layer is anisotropically etched back to form spacers 142 using conventional techniques. In addition, formation of spacers 142 exposes top surfaces 128 of gate electrodes 114 and 116. Also, preferably in the same etch step, the portions of nitride layer 119 and oxide layers 118 and 112 are removed to expose the top surfaces of source/drain regions 138. Next, conventional silicide layers (not shown) are preferably formed over source/drain doped regions 138 and gate electrodes 114 and 116. Finally, conventional processing is used to provide contacts (not shown) to doped regions 138 and to complete the devices.

Figure 18:
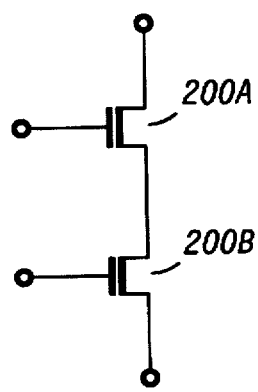
FIG. 18 is a circuit schematic of a stacked, unilateral graded-channel semiconductor device structure in accordance with an embodiment of the present invention.

FIG. 18 is a schematic diagram of a stacked, unilateral, graded-channel semiconductor device structure 200. This type of device is also referred to as a stacked unilateral transistor. Stacked, unilateral, graded-channel semiconductor device 200 comprises unilateral, graded-N-channel IGFETs 200A and 200B, wherein each IGFET 200A and 200B is a unilateral device having a source, a drain, and a gate. More particularly, the source of unilateral, graded-N-channel IGFET 200A is common or shared with the drain of unilateral, graded N-channel IGFET 200B. Thus, the shared source/drain connection is comprised of a doped region, e.g., 138, wherein one side of the doped region serves as a source electrode of IGFET 200A and an opposing side of the doped region serves as a drain electrode of IGFET 200B. Thus, the source and drain electrodes of stacked unilateral, graded N-channel FETs 200A and 200B, respectively, are common and asymmetric. In other words, the same doped region forms the source and drains of FETs 200A and 200B; however, the source end of the common source-drain region of FET 200A is more heavily doped than the drain end of the common source-drain region of FET 200B.

Although a stacked semiconductor device comprising two transistors is illustrated in FIG. 18, it should be noted that this is not a limitation of the present invention. In other words, stacks with more than two transistors can be manufactured using the present invention. Further, it should be understood that the present invention is not limited to forming N-channel devices, i.e., P-channel devices may also be manufactured in accordance with the present invention.

By now it should be appreciated that there has been provided a novel method of forming graded-channel field effect transistors that uses a masking technique having a low aspect ratio, which permits more steeply angled ion implantations and that allows doping of the gate electrode in the same step as the source/drain regions. In addition, this method is especially advantageous for minimally-spaced devices because diffusion of graded-channel dopant into the channel region on the drain side of the device is substantially reduced. Further, the use of spacers 23 as described above avoids the problem of source-limited diffusion. This is in contrast to the use of a photoresist mask in which a mask misalignment may expose too little of the substrate surface on the source side of the device. A further advantage is that the source region to graded-channel region capacitance is more stable due to the significantly lower misalignment tolerance associated with the use of spacers 23 in contrast to that with a photoresist mask.

It should be further appreciated that the present invention permits the formation of stacked, unilateral, graded-channel semiconductor devices that share a common doped region, wherein the one side of the common doped region serves as a source of a first of the stacked, unilateral graded-channel semiconductor devices and the other side of the common doped region serves as a drain of a second of the stacked, unilateral, graded-channel semiconductor devices. Thus, the stacked, unilateral, graded-channel semiconductor devices include shared source and drain electrodes which permit stacked, unilateral semiconductor devices to have higher packing densities and reduced capacitances. Because of the reduced capacitances, the stacked unilateral semiconductor devices are capable of operating at higher switching speeds than prior art unilateral stacked semiconductor devices.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming a semiconductor device, comprising the steps of:

providing a semiconductor substrate of a first conductivity type and a gate electrode overlying said substrate, wherein said gate electrode has a first sidewall, a second sidewall, and a top surface;

forming a spacer adjacent to said second sidewall of said gate electrode wherein said spacer has a corner distal from said gate electrode;

after said step of forming said spacer, forming a first doped region of said first conductivity type in said semiconductor substrate substantially aligned to said first sidewall of said gate electrode;

forming a doped source region of a second conductivity type in said semiconductor substrate substantially aligned to said first sidewall of said gate electrode;

forming a doped drain region of said second conductivity type in said semiconductor substrate substantially aligned to said corner of said spacer;

removing said spacer; and forming a doped drain extension region in said semiconductor substrate substantially aligned to said second sidewall of said gate electrode.

2. The method of claim 1 wherein said doped drain region has a first dopant concentration, and said doped drain extension region has a second dopant concentration less than said first dopant concentration.

3. The method of claim 1 further comprising the step of doping said gate electrode through said top surface during said step of forming said doped source region.

4. The method of claim 1 wherein said steps of forming said doped source region and forming said doped drain region are performed using a single, common ion implantation step.

5. The method of claim 1 wherein an insulating layer is disposed on said semiconductor substrate and said gate electrode is disposed on said insulating layer.

6. The method of claim 1, wherein the step of forming a spacer adjacent to said second side wall includes forming an oxide adjacent the second side wall, forming silicon nitride on the oxide adjacent the second side wall, and forming an oxide on the silicon nitride, wherein the oxide on the silicon nitride serves as the spacer.

7. The method of claim 1, wherein the step of forming oxide on the silicon nitride includes depositing TEOS on the silicon nitride.

8. A method for forming a semiconductor device, comprising the steps of:

providing a semiconductor substrate of a first conductivity type and a gate electrode overlying said substrate, wherein said gate electrode has a first sidewall, a second sidewall, and a top surface;

forming a spacer adjacent to said second sidewall of said gate electrode wherein said spacer has a corner distal from said gate electrode;

after said step of forming said spacer, forming a first doped region of said first conductivity type in said semiconductor substrate substantially aligned to said first sidewall of said gate electrode;

removing said spacer;

forming a doped source region of a second conductivity type in said semiconductor substrate substantially aligned to said first sidewall of said gate electrode; and forming a doped drain region of said second conductivity type in said semiconductor substrate substantially aligned to said second sidewall of said gate electrode.

9. The method of claim 8 further comprising the step of doping said gate electrode through said top surface during said step of forming said doped source region.

10. The method of claim 8 wherein said steps of forming said doped source region and forming said doped drain region are performed using a single, common ion implantation step.

11. The method of claim 8 wherein an insulating layer is disposed on said semiconductor substrate and said gate electrode is disposed on said insulating layer.

12. The method of claim 8 wherein said step of forming a doped drain region includes forming a lightly doped drain extension region.

13. A method for forming a semiconductor device, comprising the steps of:

providing a semiconductor substrate of a first conductivity type and a gate electrode overlying said substrate, wherein said gate electrode has a first sidewall, a second sidewall, and a top surface;

forming a first spacer adjacent to said first sidewall of said gate electrode;

forming a second spacer adjacent to said second sidewall of said gate electrode wherein said second spacer has a corner distal from said gate electrode;

removing said first spacer;

after said steps of forming said second spacer and removing said first spacer, forming a first doped region of said first conductivity type in said semiconductor substrate substantially aligned to said first sidewall of said gate electrode;

forming a doped source region of a second conductivity type in said semiconductor substrate substantially aligned to said first sidewall of said gate electrode;

forming a doped drain region of said second conductivity type in said semiconductor substrate substantially aligned to said corner of said second spacer;

removing said second spacer; and forming a doped drain extension region in said semiconductor substrate substantially aligned to said second sidewall of said gate electrode.

14. The method of claim 13 further comprising the step of forming a conformal dielectric layer over said gate electrode prior to said steps of forming said first spacer and forming said second spacer.

15. The method of claim 14 wherein said dielectric layer is silicon oxide and said second spacer is polysilicon.

16. The method of claim 14, wherein the step of forming a conformal dielectric layer over said gate electrode includes forming a nitride layer adjacent the first and second sidewalls and forming an oxide layer on the nitride layer, wherein a portion of the oxide layer on the nitride layer serves as the first and second spacers.

17. The method of claim 16, wherein the step of forming a conformal dielectric layer over said gate electrode includes forming an oxide layer between said gate electrode and said layer of nitride.

18. The method of claim 17, further including forming a layer of oxide between said gate electrode and said layer of nitride.

19. The method of claim 13 further comprising the step of annealing said first doped region to provide a graded channel region under said gate electrode.

20. A method of forming a semiconductor device, comprising the steps of:

providing a semiconductor substrate of a first conductivity type;

forming an insulating layer on said semiconductor substrate;

forming a gate electrode on said insulating layer, wherein said gate electrode has a first sidewall, a second sidewall, and a top surface;

forming a dielectric layer on said insulating layer and said gate electrode;

forming a polysilicon layer on said dielectric layer;

anisotropically etching said polysilicon layer, using said dielectric layer as an etch stop, to provide a first spacer adjacent to said first sidewall of said gate electrode and a second spacer adjacent to said second sidewall of said gate electrode, wherein said second spacer has a bottom corner distal from said gate electrode;

removing said first spacer;

after said steps of forming said second spacer and removing said first spacer, forming a first doped region of said first conductivity type in said semiconductor substrate substantially aligned to said first sidewall of said gate electrode;

after said step of forming said first doped region, forming a doped source region of a second conductivity type in said semiconductor substrate substantially aligned to said first sidewall of said gate electrode;

forming a doped drain region of said second conductivity type in said semiconductor substrate substantially aligned to said bottom corner of said second spacer;

removing said second spacer; and forming a doped drain extension region in said semiconductor substrate substantially aligned to said second sidewall of said gate electrode.

21. The method of claim 20 wherein said step of anisotropically etching further provides a top corner of said second spacer proximate to said gate electrode and substantially level with said dielectric layer.

22. The method of claim 21 further comprising the step of doping said gate electrode through said top surface during said step of forming said doped source region.

23. The method of claim 22 wherein said steps of doping said gate electrode, forming said doped source region, and forming said doped drain region are performed using a single, common ion implantation step.

24. The method of claim 23 wherein said step of forming said first doped region is performed using an angled ion implantation.

25. The method of claim 24 wherein said dielectric layer is silicon oxide.

26. The method of claim 24, wherein the step of forming a dielectric layer on said insulating layer and said gate electrode includes forming said dielectric layer as a multi-layer structure comprising a first oxide layer, a nitride layer disposed on said first oxide layer and a second oxide disposed on said nitride layer.

27. The method of claim 20, wherein the step of forming a dielectric layer on said insulating layer and said gate electrode includes forming said dielectric layer as a multi-layer structure comprising nitride and oxide.

* * * * *